United States Patent
Camus (10) Patent No.: US 11,035,806 B2
(45) Date of Patent: Jun. 15, 2021

(54) DEVICES AND SYSTEMS FOR IMPROVED COLLECTION EFFICIENCY AND RESOLUTION OF WAVELENGTH DISPERSIVE SPECTROMETRY

(71) Applicant: EDAX, Incorporated, Mahwah, NJ (US)

(72) Inventor: Patrick Paul Camus, Pen Argyl, PA (US)

(73) Assignee: EDAX, Incorporated, Mahwah, NJ (US)

(*) Notice: Subject to any disclaimer, the term of this patent is extended or adjusted under 35 U.S.C. 154(b) by 0 days.

(21) Appl. No.: 16/723,811

(22) Filed: Dec. 20, 2019

(65) Prior Publication Data

US 2020/0200691 A1 Jun. 25, 2020

Related U.S. Application Data

(60) Provisional application No. 62/783,877, filed on Dec. 21, 2018.

(51) Int. Cl.
| | | |
|---|---|---|
| *G02B 27/30* | (2006.01) | |
| *G01N 23/207* | (2018.01) | |
| *G01J 3/453* | (2006.01) | |
| *G01J 3/02* | (2006.01) | |

(52) U.S. Cl.
CPC .......... *G01N 23/2076* (2013.01); *G01J 3/021* (2013.01); *G01J 3/4532* (2013.01); *G02B 27/30* (2013.01)

(58) Field of Classification Search
CPC ...... G02B 27/30; G01N 23/2076; G01J 3/021
See application file for complete search history.

(56) References Cited

U.S. PATENT DOCUMENTS

| | | | | |
|---|---|---|---|---|
| 3,143,651 | A * | 8/1964 | Riccardo Giacconi | G21K 1/06 378/43 |
| 5,001,737 | A * | 3/1991 | Lewis | G21K 1/02 378/145 |
| 9,036,789 | B2 * | 5/2015 | Masaki | G21K 1/062 378/149 |
| 2004/0080938 | A1 * | 4/2004 | Holman | F21S 8/08 362/231 |
| 2017/0336334 | A1 * | 11/2017 | Yun | H01J 35/08 |

* cited by examiner

*Primary Examiner* — David P Porta
*Assistant Examiner* — Fani Boosalis
(74) *Attorney, Agent, or Firm* — Ray Quinney & Nebeker P.C.; John O. Carpenter (57) ABSTRACT

A device for the collection of X-rays includes at least one multi-reflection reflector cone. The multi-reflection reflector cone has a focal axis. A first portion of the multi-reflection reflector cone is oriented at a first angle to the focal axis, and a second portion of the multi-reflection reflector cone is oriented at a second angle to the focal axis.

20 Claims, 6 Drawing Sheets

DEVICES AND SYSTEMS FOR IMPROVED COLLECTION EFFICIENCY AND RESOLUTION OF WAVELENGTH DISPERSIVE SPECTROMETRY

CROSS-REFERENCE TO RELATED APPLICATIONS

This application claims priority to and the benefit of U.S. Provisional Patent Application No. 62/783,877, filed on Dec. 21, 2018, which is hereby incorporated by reference in its entirety.

BACKGROUND OF THE DISCLOSURE

X-ray spectrometry has grown into a robust analytic technique for the measurement of material properties. Energy dispersive spectrometry ("EDS") and wavelength dispersive spectrometry ("WDS") are analytical techniques performed in an electron microscope ("EM") in a low-pressure or near vacuum environment. A sample is positioned beneath a column housing an electron source. The electron source may be any suitable source, such as a tungsten filament, thermal field emission, or $LaB_6$ electron source. The electron source emits electrons that are directed in a beam through the column and toward a sample chamber. The sample chamber is connected to the column and allows a sample to be held in line with the electron beam for imaging and analysis.

X-ray spectrometry conventionally images and analyzes surfaces in which an interaction volume of the electron beam interacts with the desired sample region. The sample may have an unprepared surface allowing sampling of the exposed surface (e.g., particles or broken and/or cut surfaces) or a prepared surface that is substantially flat. Non-conductive samples may be made more conductive by deposition of a conductive layer over at least part of the surface in order to provide a conductive path to ground. For example, carbon layers or gold layers sputtered onto the surface of a sample can provide a conductive layer that dissipates charge from the sample to the sample stage or other ground within the sample chamber.

BRIEF SUMMARY OF THE DISCLOSURE

In some embodiments, a device for the collection of X-rays includes at least one multi-reflection reflector cone. The multi-reflection reflector cone has a focal axis. A first portion of the multi-reflection reflector cone is oriented at a first angle to the focal axis, and a second portion of the multi-reflection reflector cone is oriented at a second angle to the focal axis.

In some embodiments, a device for the collection of X-rays includes a detection surface, a diffractor, and a collimator. The detection surface detects incident X-rays, and the diffractor is positioned to diffract X-rays toward the detection surface. The collimator includes at least one multi-reflection reflector cone. The multi-reflection reflector cone has a focal axis. A first portion of the multi-reflection reflector cone is oriented at a first angle to the focal axis, and a second portion of the multi-reflection reflector cone is oriented at a second angle to the focal axis. The collimator also includes a polycapillary optical element coaxial with the at least one multi-refection reflector cone and an aft support supporting the polycapillary optical element and the at least one multi-reflection reflector cone.

In some embodiments, a method of collecting X-rays includes receiving an incoming X-ray at a first angled surface of a collimator, reflecting the incoming X-ray at a grazing angle from the first angled surface, reflecting the incoming X-ray at a grazing angle from a second angled surface of the collimator, diffracting the incoming X-ray with a diffractor, and detecting the incoming X-ray with a detection surface.

This summary is provided to introduce a selection of concepts that are further described below in the detailed description. This summary is not intended to identify specific features of the claimed subject matter, nor is it intended to be used as an aid in limiting the scope of the claimed subject matter.

Additional features of embodiments of the disclosure will be set forth in the description which follows. The features of such embodiments may be realized by means of the instruments and combinations particularly pointed out in the appended claims. These and other features will become more fully apparent from the following description and appended claims, or may be learned by the practice of such exemplary embodiments as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 2-1 depicts a schematic representation of wavelength dispersive spectrometry with a diffractor positioned at a first position, according to at least one embodiment described herein;

FIG. 2-2 depicts a schematic representation of wavelength dispersive spectrometry with a diffractor positioned at a second position, according to at least one embodiment described herein;

FIG. 2-3 depicts a schematic representation of wavelength dispersive spectrometry with a diffractor positioned at a third position, according to at least one embodiment described herein;

DETAILED DESCRIPTION

A wavelength dispersive spectrometer ("WDS") detects X-rays and measures the energy and quantity of the detected X-rays. For example, a WDS detector may have a detection surface, such as a semiconductor, that may react when an X-ray emitted by a sample contacts the detection surface. The detection surface may generate a voltage signal when an X-ray strikes the detection surface. A WDS detector passes X-rays to the detection surface by diffraction of the incoming characteristic X-rays. Only X-rays of the selected wavelength are passed to the detection surface. The wavelength of the characteristic X-ray correlates to the atom of the sample that emitted the X-ray.

Additionally, while the methods described herein are described in relation to a WDS detector, at least some of the methods may be conducted using energy dispersive spectrometry ("EDS"). EDS detectors may detect emitted X-rays similarly to a WDS detector but measure the voltage of the electron cloud created in the detection surface by the incoming characteristic X-ray to calculate the energy of the X-ray. The energy of the X-ray correlates to the atom of the sample that emitted the X-ray.

Figure 1:
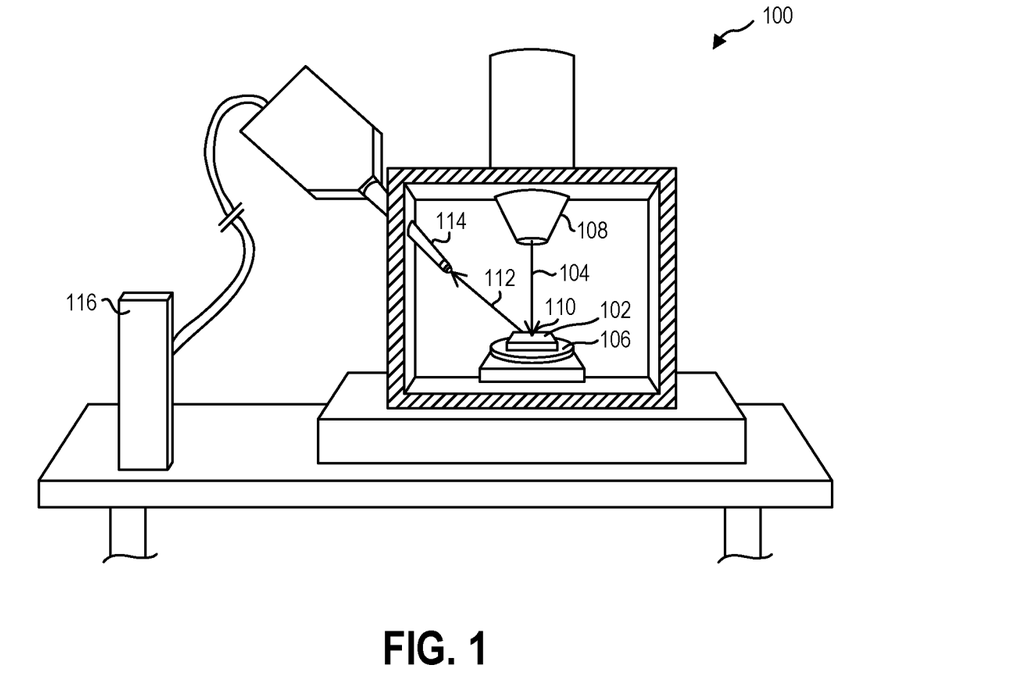
FIG. 1 depicts an embodiment of conventional X-ray spectrometry performed in a scanning electron microscope ("SEM"), according to at least one embodiment described herein.

FIG. 1 illustrates a data collection system 100 having a sample 102 located in line with a beam 104. While the present example of a data collection system 100 is an EM (scanning or transmission) and an electron beam, the present disclosure may be applicable to other analysis techniques, such as those utilizing focused and/or broad energy beams from an energy beam source such as an X-ray source, a microwave source, an ion source, a proton source, a gamma source, a visible light source, a laser source, any other directed energy source that may excite the sample 102, or combinations thereof. The sample 102 may be located on a sample stage 106. The beam 104 and sample are movable relative to one another to alter the location of the beam 104 relative to the sample 102. In some embodiments, optics in a column 108 of the data collection system 100, such as scan coils, may move (i.e., deflect) the beam 104 relative to the sample stage 106 to alter the location of the beam 104 relative to the sample 102. In other embodiments, both the sample stage 106 may be movable relative to the beam 104 and the beam 104 may move (i.e., deflect) relative to the sample stage 106.

The data collection system 100 may provide an electron beam 104 that is accelerated towards and focused at the sample 102. The electron beam may have a variety of accelerating voltages and a variety of beam currents. The accelerating voltage affects the energy of the X-rays generated during interaction of the electron beam 104 with the sample 102. The beam current affects the quantity of X-rays generated during interaction of the electron beam with the sample 102.

The beam 104 excites a localized sampling location 110 on the sample 102. The excited sampling location 110 subsequently emits one or more characteristic signals 112 toward a signal detector 114. The signal detector 114 may detect the characteristic signals 112 and, in some embodiments with the help of a computing device 116, may measure the energy, wavelength, or other properties of the characteristic signals 112. In some embodiments, the signal detector 114 and/or computing device 116 may subsequently report or present the measured energy of the characteristic signals 112 to a user, for example, through a display, a monitor, a report template, or readable media.

The signal detector 114 may be a WDS and the characteristic signal 112 may be characteristic X-rays (i.e., secondary X-rays emitted by atoms of the sample upon excitation by the beam 104). The WDS receives the characteristic X-rays and directs the X-rays via Bragg diffraction toward a detection surface. The WDS selectively passes a narrow range of wavelengths at any given time, allowing the WDS to detect and "count" the X-rays of a particular wavelength range serially.

Figure 21:
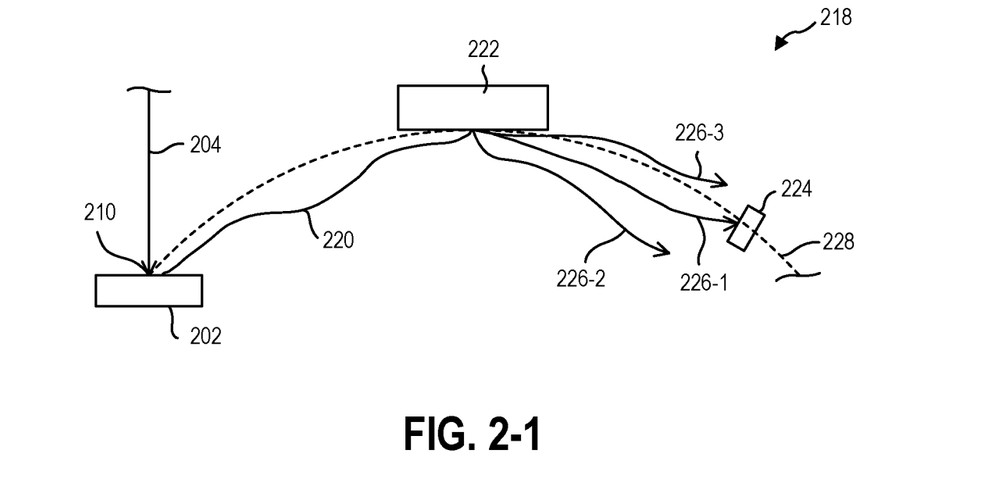

FIG. 2-1 schematically illustrates an example of X-rays moving through a WDS 218. The beam 204 is incident upon a sample 202 at a sampling location 210 and imparts energy to the sample 202 to excite atoms of the sample 202. The excited atoms dissipate the excess energy by emitting various energetic particles. Among other characteristic signals emitted, secondary X-rays 220 are emitted from the sample as the atoms return to a lower energy state. The secondary X-rays 220 are emitted from the sample and some of the X-rays 220 are redirected by a diffractor 222. The diffractor 222 may be a crystal or other multi-layer diffracting element that diffracts the secondary X-rays 220 along according to Bragg diffraction toward a detection surface 224.

Different secondary X-rays 220 will have different wavelengths dependent upon the atom that emitted the secondary X-ray 220. The Bragg diffraction will direct secondary X-rays 220 with different wavelengths along different diffracted paths 226-1, 226-2, 226-3. In a conventional WDS 218, the sampling location 210, diffractor 222, and detection surface 224 all lie on a Rowland circle 228. The orientation of the diffractor 222 and/or the position of the detection surface 224 may be changed to scan through the different wavelengths of the secondary X-rays 220 to evaluate the chemistry of the sample 202 at the sampling location 210.

Figure 22:
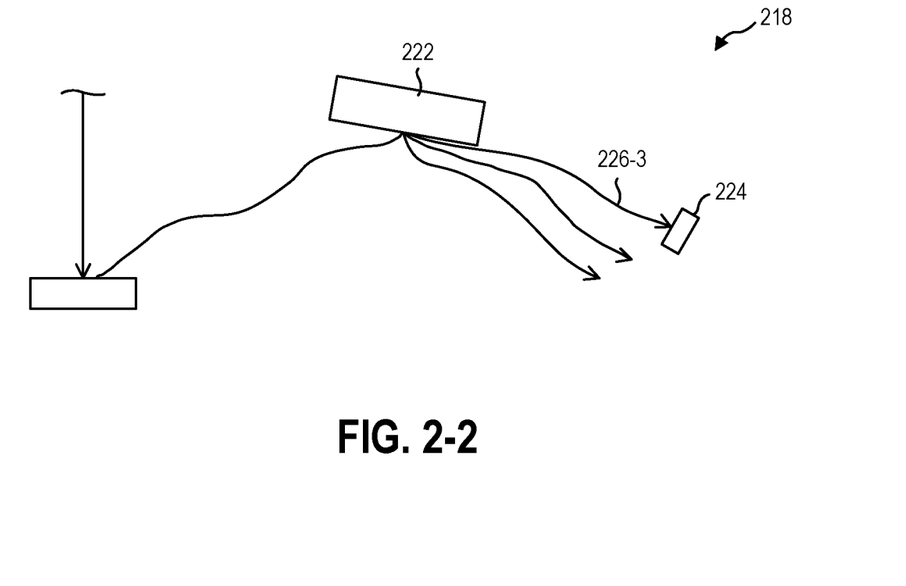
Figure 23:
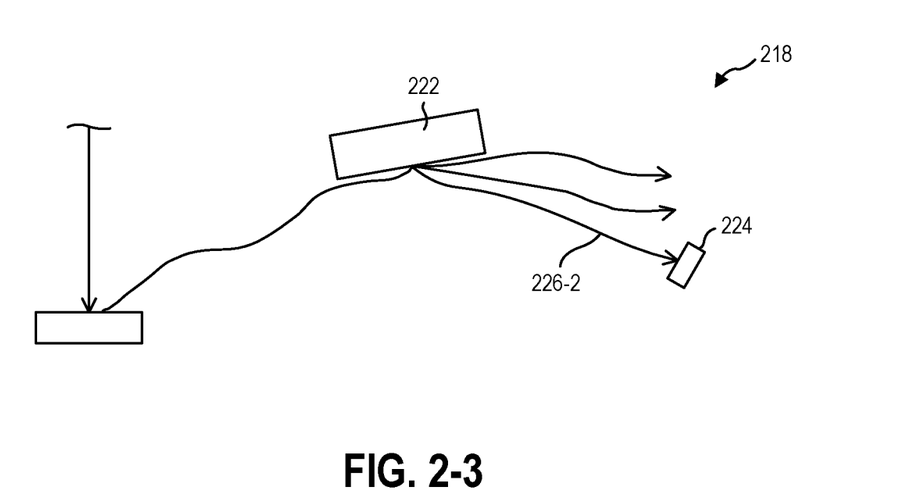

FIG. 2-2 illustrates an example of changing the orientation of the diffractor 222 to change the diffracted path 226-3 that is incident with the detection surface 224. By orienting the diffractor 222 in another position, yet other diffracted paths 226-2 are oriented at the detection surface 224, as shown in FIG. 2-3. In other embodiments, the position of the detection surface 224 is moved. A WDS 218 may include a plurality of diffractors and/or a plurality of detection surfaces. For example, a WDS may include diffractors with different interplanar distances that allow for the diffraction of X-rays of energies from 80 eV to 10 keV or more, depending on the application.

Figure 3:
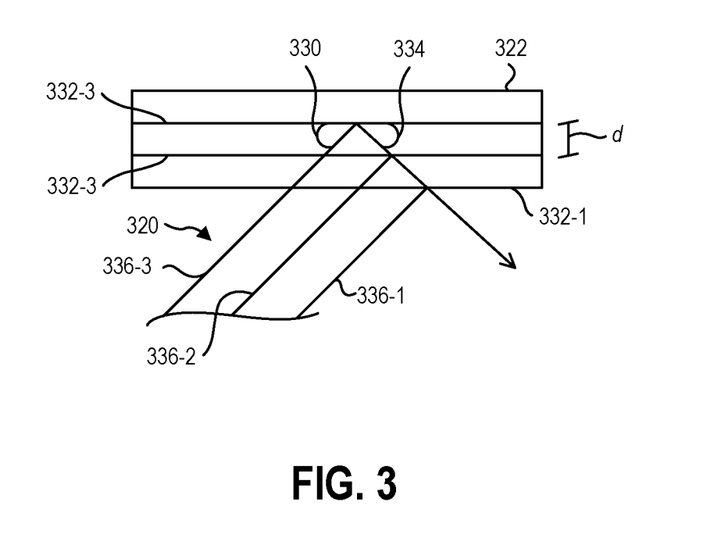
FIG. 3 illustrates a side schematic representation of Bragg diffraction of characteristic X-rays, according to at least one embodiment described herein.

FIG. 3 illustrates an example of Bragg diffraction and how the interplanar distance affects the diffraction. Bragg diffraction is the specular scattering of radiation from parallel planes. Bragg diffraction occurs when radiation, with a wavelength comparable to atomic spacings, is scattered in a specular fashion by the atoms of a crystalline system and undergoes constructive interference. For a crystalline solid, the waves are scattered from lattice planes 332-1, 332-2, 332-3 separated by the interplanar distance d. The secondary X-rays 320 approach the diffractor 322 at an incident angle 330. The X-rays will scatter from the planes 332-1, 332-2, 332-3 of the diffractor 322 at a departure angle 334 equal to the incident angle 330.

The secondary X-rays 320 along a first path 336-1 that scatter from the first lattice plane 332-1 will travel a different path length than the secondary X-rays 320 along a second path 336-2 that scatter from a second lattice plane 332-2. Similarly, the secondary X-rays 320 along the third path 336-3 or other paths that scatter from the third lattice plane 332-3 or other lattice planes will further travel a different path. The difference in the path lengths will cause constructive or deconstructive interference, depending on the wavelength of the secondary X-ray 320 and the additional path lengths between the first path 336-1, second path 336-2, third path 336-3, or other paths. As such, the incident angle 330 and interplanar distance d may allow the orientation of the diffractor 322 to selectively pass secondary X-rays 320 of a chosen wavelength.

Figure 4:
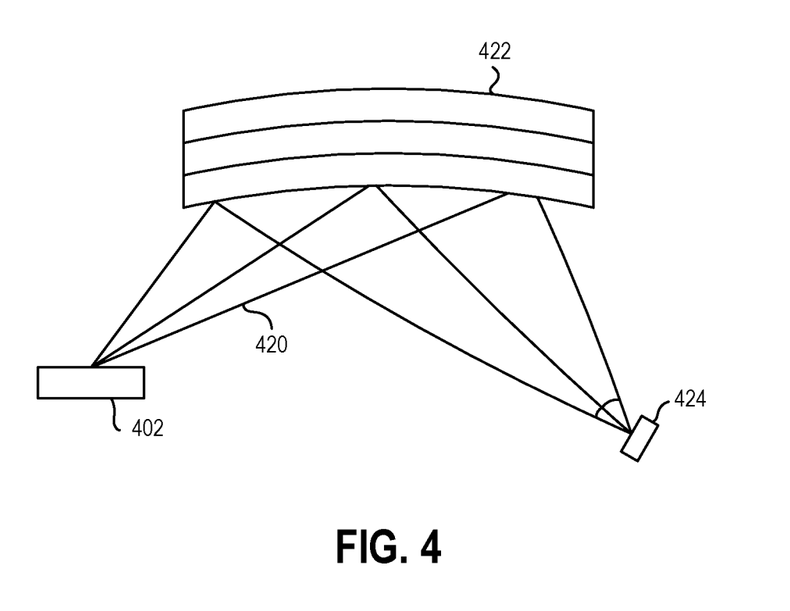
FIG. 4 illustrates an example a curved diffractor focusing diverging X-rays from a sample, according to at least one embodiment described herein.

Because WDS operates by selecting a narrow range of wavelengths via Bragg diffraction, collection rates of the characteristic signal from the sample can be low. FIG. 4 illustrates an example curved diffractor 422 that allows for focusing of divergent secondary X-rays 420 from the sample 402. The detection surface 424 can, thereby, receive a greater number of X-rays 420 from the sample 402. A curved diffractor 422 is difficult to manufacture. Divergent X-rays can also be directed by a collimator that directs the X-rays produced by an excited sampling location.

Figure 5:
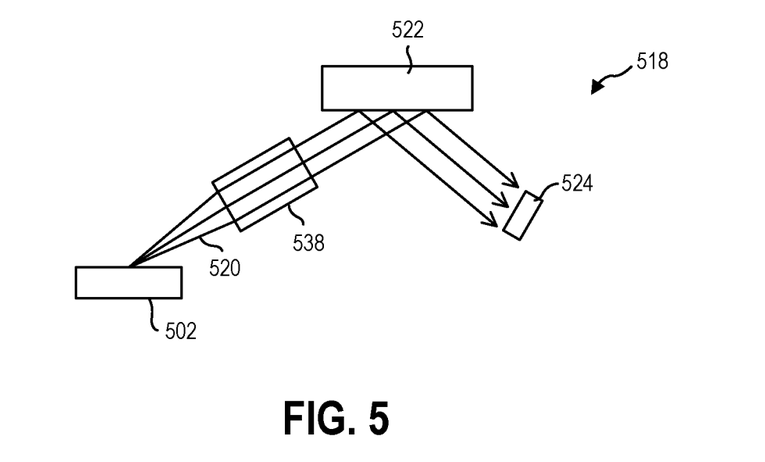
FIG. 5 illustrates an example of a collimator aligning diverging X-rays from a sample toward a diffractor as a parallel beam, according to at least one embodiment described herein.

FIG. 5 schematically illustrates collimation of the secondary X-rays from the sample 502. Collimation directs the divergent secondary X-rays 520 from the sample into substantially parallel paths. The collimator 538 directs the secondary X-rays 520 to the diffractor 522 and allows the use of a flat diffractor 522. In particular, a flat diffractor 522 may be less complicated and cheaper to manufacture while providing high optical quality relative to a curved diffractor. A flat diffractor 522 also allows the use of more diffractor materials, providing the ability to analyze larger ranges of X-ray wavelengths and energies.

The larger the solid angle the collimator 538 is able to encompass and collimate toward the diffractor 522 and detection surface 524, the more characteristic secondary X-rays 520 at a wider range of energies a WDS 518 may collect without having to reposition the diffractor 522 or use a curved diffractor. Some collimators 538 include one or more capillary or polycapillary lenses. Polycapillary lenses are arrays of small hollow glass tubes that guide the X-rays with many total internal reflections on the inside of the tubes. The array is tapered so that one end of the capillary or capillary array points at the sampling location and the other at the diffractor. Polycapillary lenses are achromatic, allowing the polycapillary lenses to collimate characteristic X-rays of a broad ranges of energies from 0.1 to 30 keV. Since only X-rays entering the capillaries within a very narrow angle will be totally internally reflected, only X-rays coming from a small spot will be transmitted through the optic.

Some WDS detectors use a reflector to direct the divergent characteristic X-rays that are emitted from the sampling location. Other WDS detectors may use the reflector in combination with the polycapillary optics. X-ray reflection rapidly loses efficiency as the incident angle of the reflection increases. Because X-rays have a much higher frequency and photon energy compared to visible light, they interact with matter very differently from how most people are familiar with reflection. Visible light is easily redirected using lenses and mirrors, but because the refractive index of all materials is very close to 1 for X-rays, X-rays instead tend to initially penetrate and eventually get absorbed in most materials without reflecting from the surface. As the incident angle increases, a greater proportion of the X-rays are absorbed. Grazing incidence reflections allow for the most efficient reflections. The angular range of the X-rays that may be collected by a parabolic reflector, therefore, is limited by the rapid decrease of efficiency as the reflection angle increases.

Figure 6:
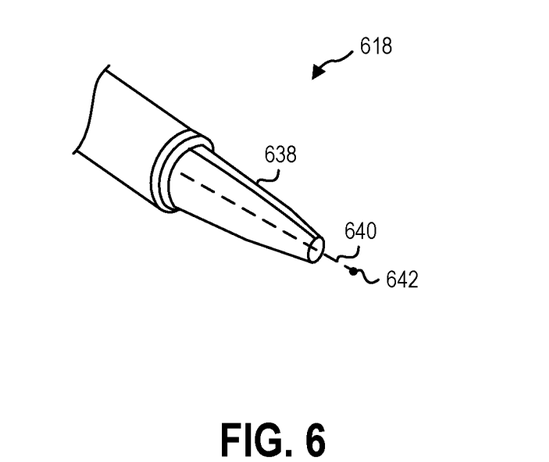
FIG. 6 is a perspective view of a collimator, according to at least one embodiment described herein.

FIG. 6 illustrates an embodiment of a WDS 618 with a WDS collimator 638 according to the present disclosure. The collimator 638 includes a rotationally symmetrical multi-radius reflector positioned around a polycapillary optic, which share a focal axis 640. The reflector and the polycapillary optic are rotationally symmetrical about the focal axis 640. The reflector and the polycapillary optic have a focal point 642 along the focal axis 640. In some embodiments, the reflector focal point and the polycapillary focal point are at the same location on the focal axis 640. The reflector focal point and the polycapillary focal point at the same location may allow for greater collection efficiency when the sampling location is positioned at that location. In other embodiments, the reflector focal point and the polycapillary focal point are different locations on the focal axis. The reflector focal point and the polycapillary focal point at different locations on the focal axis 640 may allow efficient collection along a larger range of positions for the sampling location along the focal axis 640.

In some embodiments, the collimator 638 includes a plurality of multi-radius reflectors. For example, the collimator may include 2, 3, 4, 5, or more reflectors nested radially within one another and at least partially longitudinally overlapping (in the longitudinal direction of the focal axis 640). In some embodiments, the reflectors have a common focal point along the focal axis 640. In other embodiments, the reflectors have different focal points along the focal axis 640. A shared focal point may allow for greater collection efficiency when the sampling location is positioned at that focal point. Different focal points may allow for efficient collection along a larger range of positions for the sampling location along the focal axis 640.

A collimator 638 according to the present disclosure can provide increased collection efficiency relative to a conventional collimator by both collecting X-rays from a larger sampling location, collecting a higher proportion of the X-rays generated from the sampling location, or both.

Figure 7:
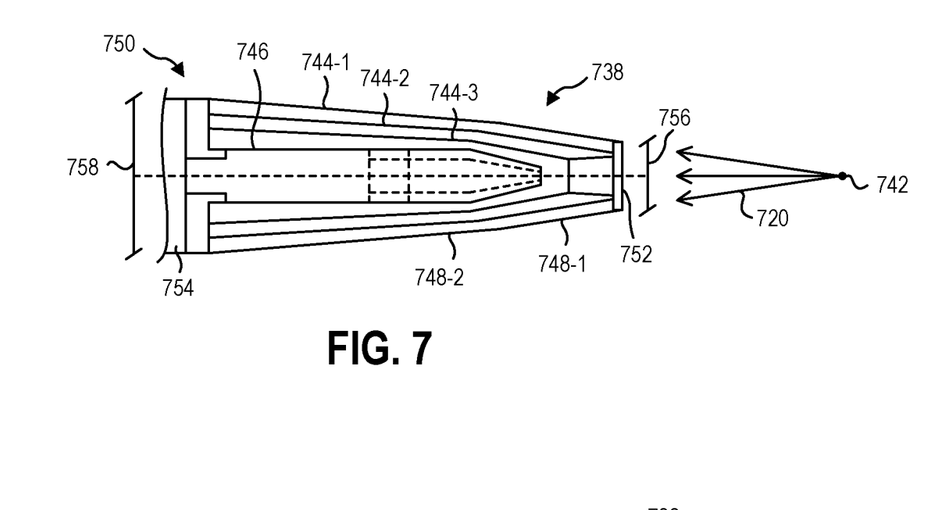
FIG. 7 is a side cross-sectional view of a collimator, according to at least one embodiment described herein.

FIG. 7 is a longitudinal cross-section of an embodiment of a collimator 738 according to the present disclosure. In some embodiments, the collimator 738 has at least one multi-reflection reflector cone 744-1, 744-2, 744-3 positioned around a polycapillary optical element 746. Each reflector cone 744-1, 744-2, 744-3 is configured to generate multiple reflections for each incoming X-ray 720. X-ray reflection is more efficient at low angles. While the total efficiency of the transmission is reduced with each additional reflection, two grazing angle reflections are more efficient than a single higher-angle reflection. For example, a grazing angle reflection may be a reflection of less than 7.5°.

In the illustrated embodiment, the collimator 728 has a plurality of reflector cones 744-1, 744-2, 744-3 with a plurality of angled surfaces 748-1, 748-2 within each cone. Each of the reflector cones 744-1, 744-2, 744-3 is configured to generate multiple reflections for each incoming X-ray 720. A first angled surface 748-1 of the reflector cone 744-1, 744-2, 744-3 reflects an incoming X-ray 720 at a low-angle reflection toward the second angled surface 748-2 of the reflector cone 744-1, 744-2, 744-3. The second angled surface 748-2 of the reflector cone 744-1, 744-2, 744-3 then reflects the X-ray 720 a second time at a low-angle reflection. The X-ray 720 then continues toward a detection surface beyond the rear portion 750 of the collimator 738.

The reflector cones 744-1, 744-2, 744-3 illustrated in FIG. 7 have two distinct angled surfaces 748-1, 748-2 with a discontinuity (i.e., a corner) between the two angled surfaces 748-1, 748-2. In other embodiments, a multi-reflection reflector cone 744-1, 744-2, 744-3 has a continuous surface that provides for a plurality of low-angle reflections for each incoming X-ray 720. For example, a multi-reflection reflector cone according to the present disclosure may have a parabolic surface in profile in the longitudinal direction. In other examples, a multi-reflection reflector cone according to the present disclosure may have a hyperbolic surface in profile in the longitudinal direction.

While the illustrated embodiment may reflect an incoming X-ray twice, some multi-reflection reflector cones may reflect the X-ray more than twice. For example, a reflector cone according to the present disclosure may have three distinct angled surfaces and reflect an X-ray three times. In other examples, a reflector cone can have a combination of curved surfaces and angled surfaces in longitudinal profile. For example, a reflector cone may have a curved surface proximate a tip of the collimator and an angled surface that is straight in longitudinal profile (e.g., as illustrated in FIG. 7) after the curved surface. The curved surface may reflect the X-ray once or twice, and the angled surface may reflect the X-ray a second or third time.

A forward support 752 and/or aft support 754 can hold the reflector cones 744-1, 744-2, 744-3 and polycapillary optical element 746 in alignment. Because the reflection angles are low in a collimator 738 according to the present disclosure, the alignment and spacing of the array of reflector cones 744-1, 744-2, 744-3 and polycapillary optical element 746 are critical. The forward support 752 and aft support 754 can support the alignment to ensure the X-rays 720 are properly directed toward a diffractor, as described herein. In some embodiments, the aft support 754 alone can sufficiently aligned the focal axes of the reflector cones 744-1, 744-2, 744-3 and polycapillary optical element 746.

A forward support 752 and aft support 754 each have a diameter that define a support ratio. In some embodiments, the support ratio of forward support diameter 756 to aft support diameter 758 is less than 1:1 (i.e., the forward support diameter is less than the aft support diameter). In other embodiments, the support ratio is less than 1:2. In yet other embodiments, the support ratio is less than 1:3. In at least one example, the forward support diameter is about 10 mm and the aft support diameter is about 30 mm.

In some embodiments, a focal length from the tip of the collimator 738 (e.g., the forward support 752) to the focal point 742 is in a range having an upper value, a lower value, or upper and lower values including any of 10 mm, 12.5 mm, 15 mm, 17.5 mm, 20 mm, 22.5 mm, 25 mm, or any values therebetween. For example, the focal length from the tip of the collimator 738 is greater than 10 mm. In other examples, the focal length from the tip of the collimator 738 is less than 25 mm. In yet other examples, the focal length from the tip of the collimator 738 is between 10 mm and 25 mm. In further examples, the focal length from the tip of the collimator 738 is between 15 mm and 20 mm. In at least one example, the focal length from the tip of the collimator 738 is about 17.8 mm.

The collimator 738 has a length from the rear of the collimator 738 (e.g., the aft support 754 where the diverging X-rays from the focal point 742 are parallel toward a diffractor) to the focal point 742. In some embodiments, the length from the rear of the collimator 738 to the focal point 742 is in a range having an upper value, a lower value, or upper and lower values including any of 90 mm, 95 mm, 100 mm, 105 mm, 110 mm, 115 mm, 120 mm, or any values therebetween. For example, the length from the rear of the collimator 738 is greater than 90 mm. In other examples, the length from the rear of the collimator 738 is less than 120 mm. In yet other examples, the length from the rear of the collimator 738 is between 90 mm and 120 mm. In further examples, the length from the rear of the collimator 738 is between 95 mm and 110 mm. In at least one example, the length from the rear of the collimator 738 is about 102 mm.

In some embodiments, an angle of collection of the collimator 738 from the focal point 742 is up to 30°. In other embodiments, angle of collection of the collimator 738 from the focal point 742 is up to 25°. In at least one embodiment, an angle of collection of the collimator 738 from the focal point 742 is up to 20°.

Figure 8:
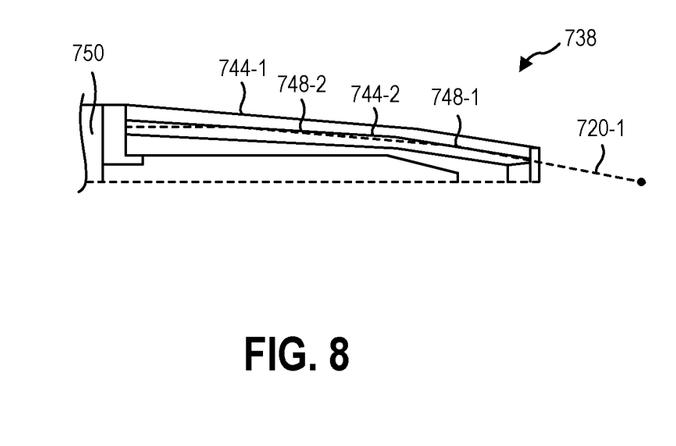
FIG. 8 is a side cross-sectional view of the collimator of FIG. 7 receiving an X-ray with a multi-reflective reflector cone from a sampling location.
Figure 9:
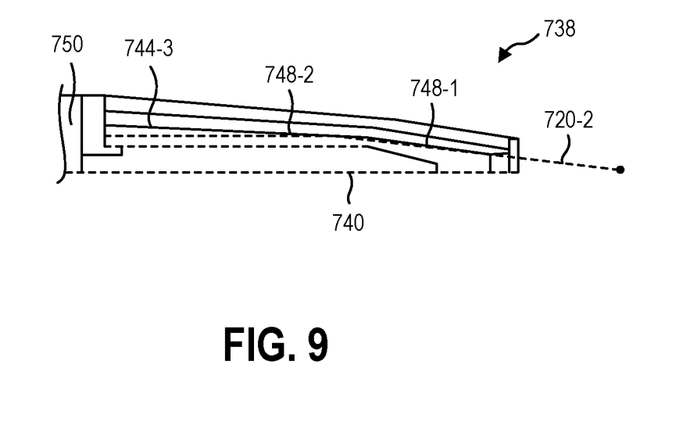
FIG. 9 is a side cross-sectional view of the collimator of FIG. 7 receiving another X-ray with another multi-reflective reflector cone from a sampling location.

FIG. 8 and FIG. 9 are longitudinal cross-sectional views of the collimator 738 of FIG. 7, illustrating the interaction with incoming X-rays 720 of different angles. FIG. 8 shows the trajectory of a high-angle X-ray 720-1 captured by a second reflector cone 744-2 inside an outer first reflector cone 744-1. The second reflector cone 744-2 has a first angled surface 748-1 and a second angled surface 748-2. The first angled surface 748-1 reflects the high-angle X-ray 720-1 toward the second angled surface 748-2, which, in turn, reflects the high-angle X-ray toward aft support 754 and out of the collimator 738 toward the diffractor.

In some embodiments, a first angled surface 748-1 of the outer first reflector cone 744-1 is oriented at less than 15° from the focal axis 740 of the collimator 738. In other embodiments, a first angled surface 748-1 of the outer first reflector cone 744-1 is oriented at less than 12.5° from the focal axis 740 of the collimator 738. In yet other embodiments, a first angled surface 748-1 of the outer first reflector cone 744-1 is oriented at less than 10° from the focal axis 740 of the collimator 738.

In some embodiments, a second angled surface 748-2 of the outer first reflector cone 744-1 is oriented at less than 7.5° from the focal axis 740 of the collimator 738. In other embodiments, a first angled surface 748-1 of the outer first reflector cone 744-1 is oriented at less than 6.25° from the focal axis 740 of the collimator 738. In yet other embodiments, a first angled surface 748-1 of the outer first reflector cone 744-1 is oriented at less than 5° from the focal axis 740 of the collimator 738.

The first reflection of the high-angle X-ray 720-1 at a first angled surface 748-1 may be less than 7.5°. In other examples, the first reflection of the high-angle X-ray 720-1 at a first angled surface 748-1 may be less than 6.25°. In yet other examples, the first reflection of the high-angle X-ray 720-1 at a first angled surface 748-1 may be less than 5°.

The second reflection of the high-angle X-ray 720-1 at a second angled surface 748-2 may be less than 7.5°. In other examples, the second reflection of the high-angle X-ray 720-1 at a second angled surface 748-2 may be less than 6.25°. In yet other examples, the second reflection of the high-angle X-ray 720-1 at a second angled surface 748-2 may be less than 5°. In some embodiments, an angle of a first reflection of an incoming X-ray is the same as an angle of a second reflection of the incoming X-ray. In other embodiments, an angle of a first reflection of an incoming X-ray is less than an angle of a second reflection of the incoming X-ray. In yet other embodiments, an angle of a first reflection of an incoming X-ray is greater than an angle of a second reflection of the incoming X-ray.

FIG. 9 shows the trajectory of an intermediate-angle X-ray 720-2 that is captured by a third reflector cone 744-3. The third reflector cone 744-3 also has a first angled surface 748-1 and a second angled surface 748-2. The first angled surface 748-1 reflects the intermediate-angle X-ray 720-2 toward the second angled surface 748-2, which, in turn, reflects the intermediate-angle X-ray 720-2 toward aft support 754 and out of the collimator 738 toward the diffractor. In some embodiments, the second reflector cone directs the high-angle X-ray (of FIG. 8) out the rear of the collimator 738 in a path parallel to the path of the intermediate angle X-ray 720-2 reflected by the third reflector cone 744-3 and parallel to a focal axis 740 of the collimator 738.

Figure 10:
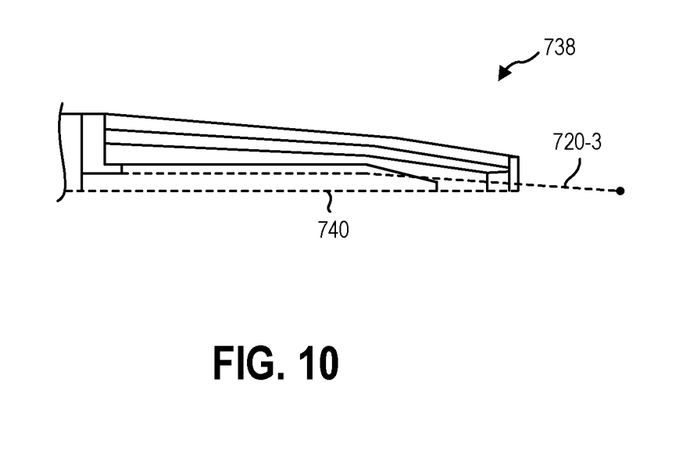
FIG. 10 is a side cross-sectional view of the collimator of FIG. 7 receiving yet another X-ray through a polycapillary optical element from a sampling location.

FIG. 10 shows the trajectory of a low-angle X-ray 720-3 received by a polycapillary optical element 746 in the center of the collimator 738 coaxial with the array of reflector cones. The polycapillary optical element 746 can redirect the low-angle X-ray 720-3 through the polycapillary optical element 746 such that the low-angle X-ray 720-3 is emitted parallel to the path of the intermediate- and high-angle X-rays that are reflected by the reflector cones and parallel to a focal axis 740 of the collimator 738. The X-rays can then each be diffracted and detected as described herein.

By utilizing a plurality of low-angle reflections to gradually change the direction of the incoming X-rays, a multi-reflective collimator according to the present disclosure can collimate X-rays more efficiently than a single-reflective collimator. In some embodiments, the more efficient reflection of the X-rays additionally allows an increased solid angle of collection with the same efficiency as a single-reflective collimator with a smaller solid angle. An increased solid angle of collection provides increased collection rate and improved statistics. As WDS is an inherently low-collection rate technique and WDS data collection sessions can take many minutes or hours, an increase in collection rates can substantially improve the usability of the technique.

One or more specific embodiments of the present disclosure are described herein. In an effort to provide a concise description of these embodiments, some features of an actual embodiment are described in the specification. It should be appreciated that in the development of any such actual embodiment, as in any engineering or design project, numerous embodiment-specific decisions will be made to achieve the developers' specific goals, such as compliance with system-related and business-related constraints, which may vary from one embodiment to another. It should further be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. Any element of an embodiment described herein may be combined with any element of any other embodiment described herein. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A device for the collection of X-rays, the device comprising:
    at least one multi-reflection reflector cone with a focal axis, the at least one multi-reflection reflector cone having a surface with a first portion oriented at a first angle to the focal axis and a second portion oriented at a second angle to the focal axis wherein the first portion is a first angled surface and the second portion is a second angled surface with a discontinuity therebetween.

2. The device of claim 1, at least a portion of the multi-reflection reflector cone being curved in longitudinal profile.

3. The device of claim 1, at least a portion of the multi-reflection reflector cone being parabolic in longitudinal profile.

4. The device of claim 1, at least a portion of the multi-reflection reflector cone being hyperbolic in longitudinal profile.

5. The device of claim 1, the multi-reflection reflector cone having a focal length of less than 25 millimeters.

6. The device of claim 1, further comprising a polycapillary optical element coaxial with the at least one multi-reflection reflector cone.

7. The device of claim 6, the polycapillary optical element and the multi-reflection reflector cone having the same focal point.

8. The device of claim 6, the polycapillary optical element and the multi-reflection reflector cone having different focal points.

9. The device of claim 6, the multi-reflection reflector cone and the polycapillary optical element transmitting X-rays in parallel paths at a rear of the multi-reflection reflector cone and polycapillary optical element.

10. The device of claim 1, the multi-reflection reflector cone configured to reflect an x-ray originating at a focal point of the multi-reflection reflector cone at least twice.

11. The device of claim 1, the first angle of the multi-reflection reflector cone being less than 15° from the focal axis.

12. The device of claim 1, the second angle of the multi-reflection reflector being less than 7.5° from the focal axis.

13. The device of claim 1, the multi-reflector reflection cone having a length from a rear of the multi-reflector reflection cone to a focal point of less than 120 millimeters.

14. A device for the collection of X-rays, the device comprising:
 a detection surface configured to detect incident X-rays;
 a diffractor, the diffractor positioned to diffract X-rays toward the detection surface; and
 a collimator, the collimator oriented to direct X-rays toward the diffractor including:
  at least two multi-reflection reflector cones sharing a focal axis and longitudinally overlapping one another, each of the multi-reflection reflector cones having a surface with a first portion oriented at a first angle to the focal axis and a second portion oriented at a second angle to the focal axis,
  a polycapillary optical element coaxial with the at least one multi-reflection reflector cone, and
  an aft support supporting the polycapillary optical element and the at least one multi-reflection reflector cone.

15. The device of claim 14, the collimator having a focal length from a tip of the collimator to a focal point of less than 25 millimeters.

16. The device of claim 14, the collimator having a length from a rear of the collimator to a focal point of less than 120 millimeters.

17. The device of claim 14, the collimator including at least three multi-reflection reflector cones.

18. The device of claim 14, the first angle of the at least one multi-reflection reflector cone being less than 15° and the second angle being less than 7.5°.

19. The device of claim 14, the collimator having an angle of collection up to 30°.

20. A method of collecting X-rays, the method comprising:
 receiving a first incoming X-ray at a first angled surface of a first multi-reflection reflector cone of a collimator;
 reflecting the first incoming X-ray at a grazing angle from the first angled surface of the first multi-reflection reflector cone;
 reflecting the first incoming X-ray at a grazing angle from a second angled surface of the first multi-reflection reflector cone of the collimator;
 diffracting the first incoming X-ray with a diffractor;
 detecting the first incoming X-ray with a detection surface;
 receiving a second incoming X-ray at a first angled surface of a second multi-reflection reflector cone of the collimator that is coaxial and longitudinally overlapping with the first multi-reflection reflector cone;
 reflecting the second incoming X-ray at a grazing angle from the first angled surface of the second multi-reflection reflector cone;
 reflecting the second incoming X-ray at a grazing angle from a second angled surface of the second multi-reflection reflector cone of the collimator;
 diffracting the second incoming X-ray with the diffractor;
 detecting the second incoming X-ray with the detection surface.

* * * * *